United States Patent [19]

Cook et al.

[11] Patent Number: 4,997,775

[45] Date of Patent: Mar. 5, 1991

[54] METHOD FOR FORMING A COMPLEMENTARY BIPOLAR TRANSISTOR STRUCTURE INCLUDING A SELF-ALIGNED VERTICAL PNP TRANSISTOR

[76] Inventors: Robert K. Cook, 33 Sunrise La., Poughkeepsie, N.Y. 12603; Chang-Ming Hsieh, 78 Starmill Rd.; Kiyosi Isihara, 7 Chadwick Ct., both of Fishkill, N.Y. 12524; Mario M. Pelella, 15 Beechwood Pk., Poughkeepsie, N.Y. 12601

[21] Appl. No.: 487,502
[22] Filed: Feb. 26, 1990
[51] Int. Cl.$^5$ .............................................. H01L 27/02
[52] U.S. Cl. ..................... 437/31; 437/162; 357/42; 357/44; 148/DIG. 11
[58] Field of Search ................. 437/31, 162; 357/42, 357/44; 148/DIG. 11

[56] References Cited

U.S. PATENT DOCUMENTS

| | | | |
|---|---|---|---|
| 3,665,266 | 5/1972 | Drozdowicz et al. | 317/235 R |
| 3,730,786 | 5/1973 | Ghosh | 148/175 |
| 4,104,086 | 8/1978 | Bondur et al. | 148/1.5 |
| 4,111,720 | 9/1978 | Michel et al. | 437/31 |
| 4,159,915 | 7/1979 | Anantha et al. | 148/1.5 |
| 4,214,315 | 7/1980 | Anatha et al. | 357/44 |
| 4,236,294 | 12/1980 | Anatha et al. | 437/31 |
| 4,256,514 | 3/1981 | Pogge | 148/1.5 |
| 4,307,180 | 12/1981 | Pogge | 430/314 |
| 4,339,767 | 7/1982 | Horng et al. | 357/44 |
| 4,412,376 | 11/1983 | DeBar et al. | 29/576 B |
| 4,485,552 | 12/1984 | Magdo et al. | 29/577 C |
| 4,531,282 | 7/1985 | Sakai et al. | 29/578 |
| 4,641,416 | 2/1987 | Iranmanesh et al. | 29/576 W |
| 4,712,125 | 12/1987 | Bhatia et al. | 357/59 |
| 4,719,185 | 1/1988 | Goth | 437/31 |
| 4,808,548 | 2/1989 | Thomas et al. | 148/DIG. 11 |
| 4,868,135 | 9/1989 | Ogura et al. | 437/31 |

FOREIGN PATENT DOCUMENTS

0301468 7/1987 European Pat. Off. .

OTHER PUBLICATIONS

IBM Technical Disclosure Bulletin, vol. 14, No. 4, Sep. 1971, "Complementary Transistors" by W. N. Jacobus et al.
IBM Technical Disclosure Bulletin, vol. 22, No. 5, Oct. 1979, "Nine-Mask Complementary Bipolar Process" by V. Y. Doo.
IBM Technical Disclosure Bulletin, vol. 31, No. 12, May 1989, "Complementary Vertical Bipolar Transistors" by Chen et al.
IBM Technical Disclosure Bulletin, vol. 24, No. 1B, Jun. 1981 "Complementary Bipolar-FET Integrated Circuit".
IBM Technical Disclosure Bulletin, vol. 16, No. 5, Oct. 1973 "Complementary Bipolar Transistor Process Using Seven Masking Steps" by S. A. Abbas et al.
IBM Technical Disclosure Bulletin, vol. 17, No. 1, Jun. 1974 "Complementary Bipolar Device Structure" by J. J. Chang et al.

*Primary Examiner*—Brian E. Hearn
*Assistant Examiner*—Gordon V. Hugo
*Attorney, Agent, or Firm*—Jeffrey L. Brandt

[57] ABSTRACT

A method of forming a complementary bipolar transistor device includes the steps of: providing a substrate of semiconductor material including at least two electrically isolated N-type device regions having a generally planar common surface; forming a P-type buried subcollar region in a first of the device regions; forming an N-type buried subcollector region in a second of the device regions; forming an N-type base region in the common surface of the first device region; forming a layer of P-doped polysilicon over the base region in the first device region and over the second device region; patterning the layer of P-doped polysilicon to form an emitter contact generally centered on the base region of the first device region and a generally annular base contact on the second device region; forming a layer of insulating material over the patterned layer of P-doped polysilicon; forming a layer of N-doped polysilicon generally conformally over the device; patterning the layer of N-doped polysilicon to form a base contact generally surrounding the emitter contact on the first device region and an emitter contact generally surrounded by the base contact on the second device region; and heating the device at least once to drive impurities from the base and emitter contacts on the first and second device regions into the device regions whereby to form a vertical PNP transistor in the first device region and a vertical NPN transistor in the second device region.

11 Claims, 4 Drawing Sheets

METHOD FOR FORMING A COMPLEMENTARY BIPOLAR TRANSISTOR STRUCTURE INCLUDING A SELF-ALIGNED VERTICAL PNP TRANSISTOR

The present invention relates generally to semiconductor devices and more particularly to a method for forming complementary bipolar transistors and the resulting structure.

BACKGROUND OF THE INVENTION

In the field of bipolar transistor devices it is generally recognized that it is desirable to incorporate complementary transistors, i.e. both NPN and PNP type transistors, onto a single chip or substrate. When complementary transistors are thus employed, in operation one type of transistor is typically on while the other type is off, both types changing on/off states relatively simultaneously. This complementary operation results in improved semiconductor chip characteristics, such as decreased power consumption and decreased signal noise.

However, it is also recognized that it is difficult to fabricate high-performance complementary transistors on a single substrate. This difficulty is due in large part to the fact that the fabrication of high-performance transistors requires a highly specialized process, and such a process is typically tailored to either the NPN or PNP type of transistor. In the past it has been extremely difficult to provide a fabrication process which yields high-performance transistors of both the NPN and PNP types on a single substrate/chip.

Those skilled in the art have addressed the task of fabricating complementary bipolar transistors in many different manners, several of which are briefly described below.

U.S. Pat. No. 4,719,185 to Goth (assigned to the assignee of the present invention) shows a complementary transistor structure wherein vertical NPN and PNP transistors are formed by ion implantation of the transistor regions. Metal contacts are subsequently provided to the transistor regions.

U.S. Pat. No. 4,485,552 to Magdo et al. (assigned to the assignee of the present invention) shows a complementary transistor structure utilizing isolation structures that permit carefully controlled impurity doping of the transistor regions. The extrinsic base region and the emitter region of the PNP device are out-diffused from doped polysilicon regions.

U.S. Pat. No. 3,730,786 to Ghosh (assigned to the assignee of the present invention) shows a method for forming complementary bipolar transistors wherein a vertical NPN emitter region and a vertical PNP base region are formed by out-diffusion from a single doped oxide layer. The NPN base region and the PNP emitter region are formed by separate diffusions.

European Patent Application 0 301 468 by Fairchild Semiconductor Corporation shows a process for fabricating complementary bipolar transistors wherein the emitter and extrinsic base regions of the complementary transistors are formed by out-diffusion from a single layer of polysilicon. This out-diffusion is performed by first defining and doping selected regions of the polysilicon layer, and then by heating the device to out-diffuse these regions into the substrate. The separation of the emitter and extrinsic base is limited by lithographic resolution of the type used to etch the polysilicon therebetween.

The present invention is directed to providing a method for fabricating high performance, complementary bipolar transistors utilizing a process compatible with current self-aligned transistor fabrication technology.

SUMMARY OF THE INVENTION

It is an object of the present invention to provide a new and improved high-performance, complementary bipolar transistor structure and a method of manufacturing the same.

It is another object of the present invention to provide a method for fabricating a complementary bipolar transistor structure including high-performance vertical NPN and PNP transistors.

It is a further object of the present invention to provide such a method of fabricating complementary bipolar transistors which utilizes self-aligned transistor fabrication technology.

It is yet another object of the present invention to provide a high-performance vertical PNP transistor structure including self-aligned emitter and base regions.

In accordance with the present invention, there is provided a method of forming a complementary bipolar transistor device comprising the steps of: providing a substrate of semiconductor material including at least two electrically isolated N-type device regions having a generally planar common surface; forming a P-type buried subcollector region in a first of the device regions; forming an N-type buried subcollector region in a second of the device regions; forming an N-type base region in the common surface of the first device region; forming a layer of P-doped polysilicon over the base region in the first device region and over the second device region; patterning the layer of P-doped polysilicon to form an emitter contact generally centered on the base region of the first device region and a generally annular base contact on the second device region; forming a layer of insulating material over the patterned layer of P-doped polysilicon; forming a layer of N-doped polysilicon generally conformally over the device; patterning the layer of N-doped polysilicon to form a base contact generally surrounding the emitter contact on the first device region and an emitter contact generally surrounded by the base contact on the second device region; and heating the device at least once to drive impurities from the base and emitter contacts on the first and second device regions into the device regions whereby to form a vertical PNP transistor in the first device region and a vertical NPN transistor in the second device region.

BRIEF DESCRIPTION OF THE DRAWINGS

These and other object, features, and advantages of the present invention will become apparent upon consideration of the following detailed description of the invention when read in conjunction with the drawing Figures, in which.

DETAILED DESCRIPTION OF THE INVENTION

Figure 1:
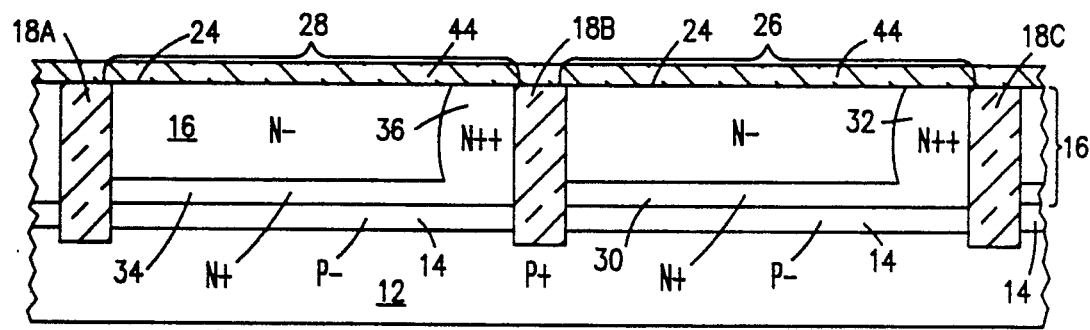
FIGS. 1-10 are cross-sectional views illustrating consecutive steps in the fabrication of complementary bipolar transistor devices in accordance with the present invention.

Referring now to the drawings, FIG. 1 shows a substrate structure 10 prepared in a conventional manner for fabricating complementary bipolar transistors in accordance with the present invention. Structure 10 includes a slab 12 of P+silicon formed, for example, by a conventional crystal-pulling process so as to have a sheet resistivity in the range of 0.01 ohm-cm. It will be understood that references to N-and P-type semiconductor materials describe the dopant impurity type and, where relevant, the relative dopant concentrations.

A layer 14 of epitaxially grown P−silicon overlies slab 12, while a layer 16 of epitaxially grown N−silicon overlies layer 14. Spaced isolation trenches 18A, 18B, 18C of insulating material extend from an upper surface 24 of layer 16 downward into slab 12 so as to provide first and second electrically isolated device regions 26, 28, respectively.

An N+buried region 30 extends between trenches 18B and 18C over P−layer 14 and is connected to surface 24 by a highly doped, N++reachthrough region 32 abutting trench 18C. A buried, N+subcollector region 34 extends in a similar manner across device region 26 between trenches 18A and 18B, and is connected to surface 24 by an N++reachthrough region 36 abutting trench 20. A layer 44 of silicon dioxide ($SiO_2$) is situated conformally over the upper surface of structure 10.

It will be appreciated by those skilled in the art that structure 10 as shown in FIG. 1 represents a conventional structure for the fabrication of semiconductor devices, and can be formed in accordance with many known processes. One exemplary process for forming structure 10 is as follows:

(A) Slab 12 is provided from a conventional crystal pull;
(B) Layer 14 is grown on slab 10 in a conventional epitaxial growth reactor, using conventional parameters, to a thickness, for example, of about 5 micrometers, and to a concentration, for example, of about $1 \times 10^{15}$ atoms/cm$^3$;
(C) The surface of layer 14 is doped to an N++conductivity, for example by ion implantation of arsenic ions at a dose of about $1 \times 10^{16}$ atoms/cm$^2$;
(D) Layer 16 is grown on layer 14 in a conventional epitaxial growth reactor, using conventional parameters, to a thickness, for example, of about 1.0 micrometers. During the growth of layer 16, the highly doped region described in step (C) auto-diffuses into layer 16, forming regions 30 and 34;
(E) Isolation trenches 18A, 18B, 18C are formed, for example by one of the processes shown in U.S. Pat. No. 4,104,086 or U.S. Pat. No. 4,307,180 (each of which is assigned to the assignee of the present invention and incorporated herein by reference);
(F) Layer 44 of $SiO_2$ is formed, for example by a conventional process of thermal oxidation to a thickness in the range of about 0.05-0.10 micrometers; and
(G) Reachthrough regions 32 and 36 are formed by conventional photolithographic masking and ion implantation.

Figure 2:
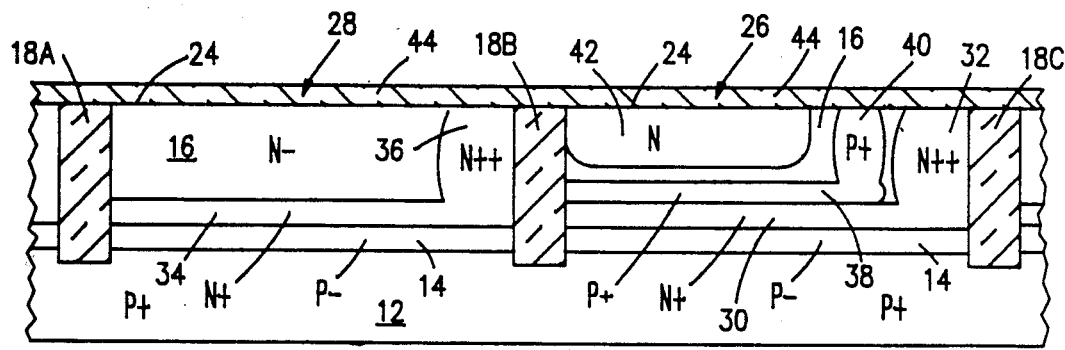

Referring now to FIG. 2, a buried P+subcollector region 38 is formed in device region 26 overlying buried region 30. A P+reachthrough region 40 is formed between surface 24 and region 38 adjacent reachthrough region 32. Subcollector region 38 and reachthrough region 40 are preferably formed by conventional, high energy, ion implantation of boron ions.

Continuing to describe FIG. 2, an N type base region 42 is formed in surface 24 of device region 26, for example using conventional photolithographic masking and ion implantation or diffusion of phosphorous. Base region 42 is positioned intermediate reachthrough region 40 and trench 18B, abutting the latter, and is spaced from buried region 30. As is described in detail below, base region 42 functions as the intrinsic base of a subsequently formed vertical PNP transistor.

Figure 3:
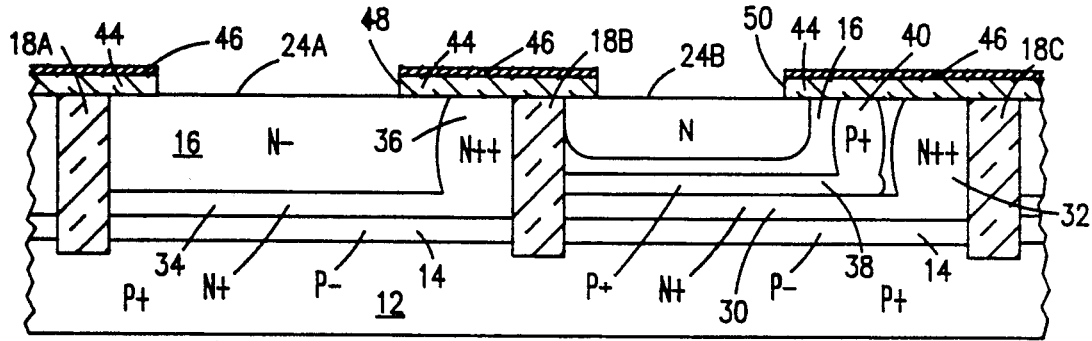

Referring now to FIG. 3, a layer 46 of silicon nitride is formed over layer 44, for example by a conventional chemical vapor deposition (CVD) process and to a thickness of about 0.10 micrometers.

Continuing to describe FIG. 3, subsequent to the formation of layer 46, conventional photolithographic masking (not shown) is used to mask and etch apertures 48 and 50. Aperture 48 is positioned so as to expose a portion 24A of the surface of device region 28, while aperture 50 is positioned so as to expose a portion 24B of the surface of base region 42 in device region 26. Layers 46 and 44 are etched to form apertures 48 and 50 using a reactive ion etching process (RIE), for example using $CF_4/CHF_3/Ar$ gases.

Figure 4:
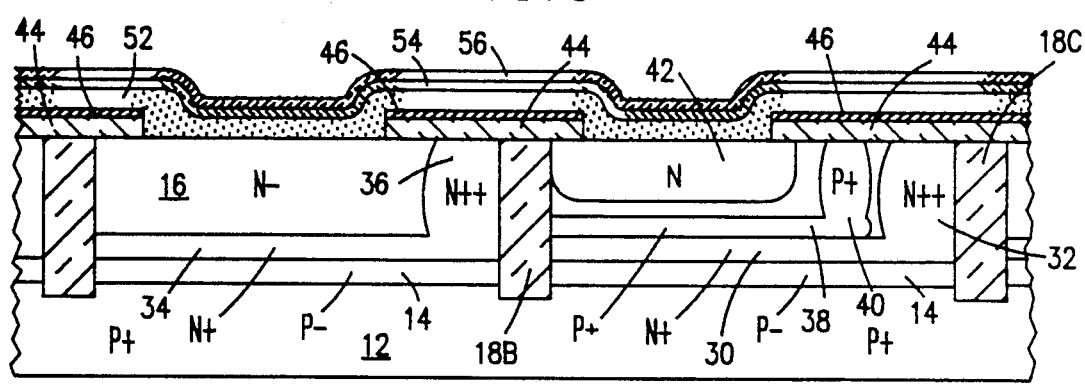

Referring now to FIG. 4, a layer 52 of P+-doped polysilicon is formed conformally over device 10. Layer 52 is formed, for example, by a conventional CVD process with in situ doping to a thickness of about 0.30 micrometers. Alternatively, layer 52 can be deposited undoped (i.e. intrinsic polysilicon) and be subsequently doped by ion implantation. A layer 54 of $SiO_2$ is formed conformally over layer 52, for example by thermal oxidation to a thickness of about 0.10 micrometers. A layer 56 of $Si_3N_4$ is formed conformally over layer 54 by a process of CVD to a thickness of about 0.15 micrometers.

Figure 5:
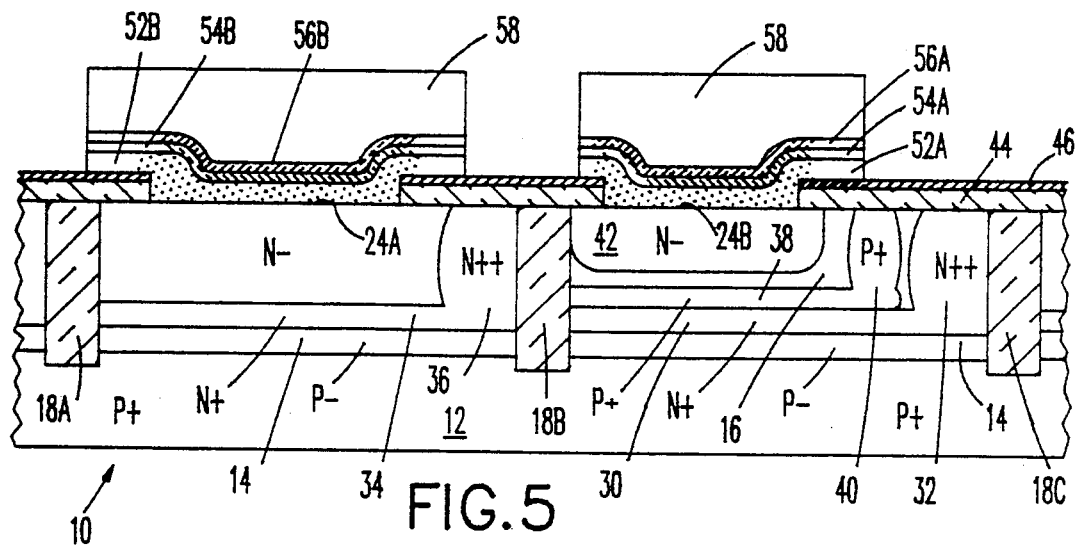

Referring now to FIG. 5, a conventional photolithographic mask 58 is utilized to mask separate portions of layers 52, 54, 56 overlying surface portions 24B and 24A of device regions 26 and 28, respectively. The unmasked portions of layers 52, 54, and 56 are removed to leave registered portions 52A, 54A, and 56A overlying surface 24B, and registered portions 52B, 54B, and 56B overlying surface 24A. Layers 56, 54, and 52 are sequentially etched by using, for example, a RIE process utilizing $CF_4/CHF_3/Ar$ and then $Cl_2$ gases.

Figure 6:
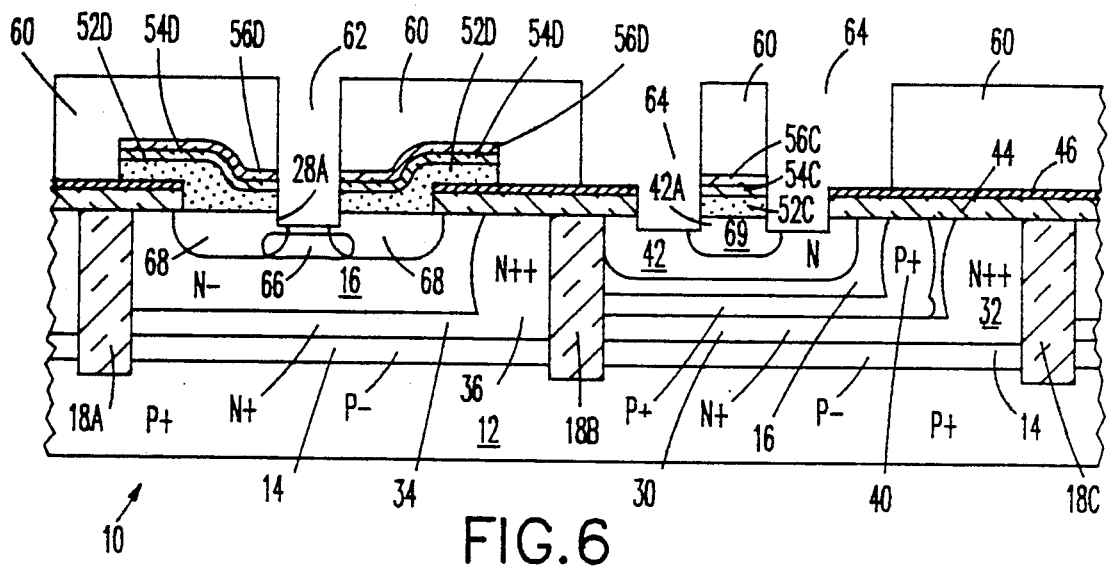

Referring now to FIG. 6, a second photolithographic mask 60 is used to mask a registered portion 52C, 54C, 56C of the layers generally centered over base region 42, and a registered portion 52D, 54D, 56D of the layers generally circumscribing a central region of surface 24A. The device is then etched such that the removed portions of these layers are indicated by apertures 62, 64. This etching of portions of layers 56, 54, and 52 is performed with a RIE process using the same etchant(s) described above. As is described in detail below, remaining polysilicon region 52C functions as the emitter contact and dopant impurity source for a subsequently formed vertical PNP transistor. Similarly, remaining polysilicon region 52D functions as the base contact and extrinsic base dopant impurity source for a subsequently formed vertical NPN transistor.

Continuing to describe FIG. 6, aperture 64 is extended a short distance, for example on the order of 0.05 micrometers, into the surface of base region 42 so as to circumscribe a raised pedestal portion 42A of base region 42. Aperture 62 is likewise extended the same distance into surface 24A of device region 28 so as to form a recess 28A. The silicon of device regions 26 and 28 is etched using, for example, a RIE process with Cl$_2$/O$_2$/Ar gases. This overetching into silicon surfaces 24A, 24B is performed to insure that no undesired remnants of polysilicon regions 52C or 52D remain within apertures 62 or 64. Mask 60 is removed in a conventional manner.

Continuing still with reference to FIG. 6, the device is subjected to a conventional thermal anneal, for example at 930 degrees centigrade for a period of 30 minutes, for the purpose of: curing any defects in the silicon; causing dopant impurities in base contact 54D to diffuse downward into device region 28 so as to form P+ extrinsic base region 68; and causing dopant impurities from emitter contact 52C to diffuse downward into device region 26 so as to form +emitter region 69. A P intrinsic base region 66 is then formed in device region 28 through aperture 62, for example by ion implantation of boron ions. It is noted that aperture 64 may be blocked out with a photolithographic mask during the ion implantation to form base region 66. However, the N doping in region 42 would overcome this P-type ion implant.

Figure 7:
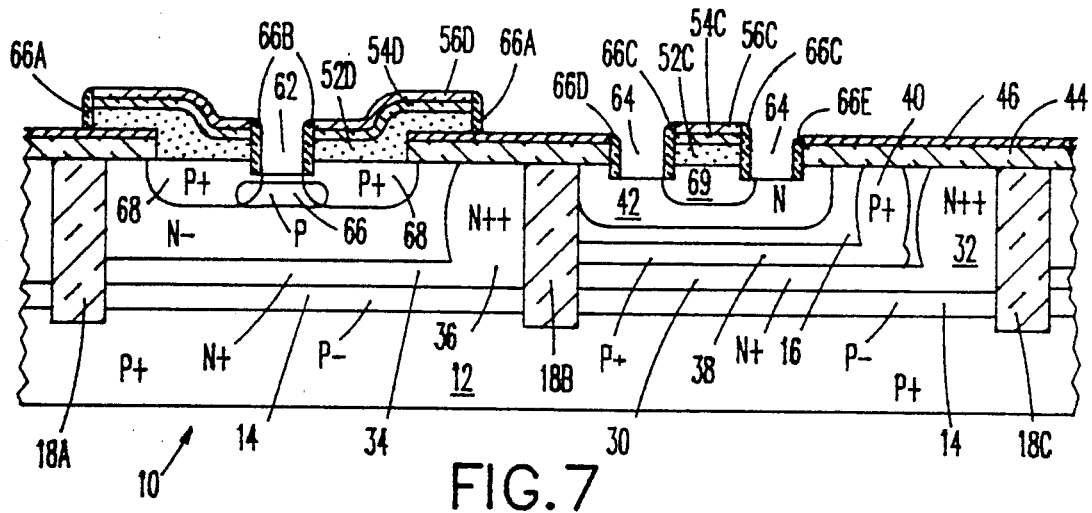

Referring now to FIG. 7, all exposed vertical edges of layers overlying structure 10 are covered with protective oxide/nitride sidewalls indicated at 66A–E. These sidewalls 66A–E are formed, for example, by sequential blanket depositions of SiO$_2$ and Si$_3$N$_4$, and a subsequent anisotropic etch to leave the indicated sidewalls. A suitable process of sidewall formation is shown and described in U.S. Pat. No. 4,256,514 to Pogge, assigned to the assignee of the present invention and incorporated herein by reference.

Figure 8:
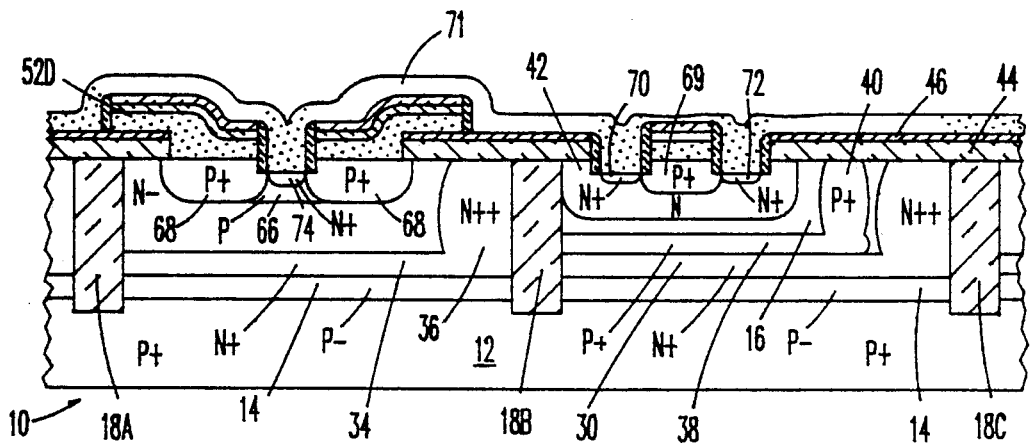

Referring now to FIG. 8, a layer 71 of N+doped polysilicon is deposited conformally over structure 10 so as to fill apertures 62 and 64. It is noted that layer 71 is insulated from polysilicon regions 52C and 52D by intervening insulating materials 54C–D, 56C–D, and insulating sidewalls 66A–E. Layer 71 is formed to a thickness of about 0.20 micrometers, for example by a conventional CVD process utilizing in situ doping, or alternatively, by depositing intrinsic polysilicon with subsequent doping by ion implantation or diffusion.

Continuing to describe FIG. 8, the device is subjected to a conventional annealing process, for example at 880 degrees centigrade for 20 minutes. This anneal causes dopant impurities to diffuse downward from layer 71 into the underlying device regions There is thus formed N+extrinsic base regions 70, 72 in device region 26, and N+emitter region 74 in device region 28.

It will thus be appreciated that a vertical NPN transistor has been formed in device region 28, including emitter region 74, intrinsic base region 66, extrinsic base region 68, and subcollector region 34. Concomitantly, in accordance with the present invention, a vertical PNP transistor has been formed in device region 26. This PNP transistor includes emitter region 69, extrinsic base regions 70, 72, intrinsic base region 42, and subcollector region 38.

Figure 9:
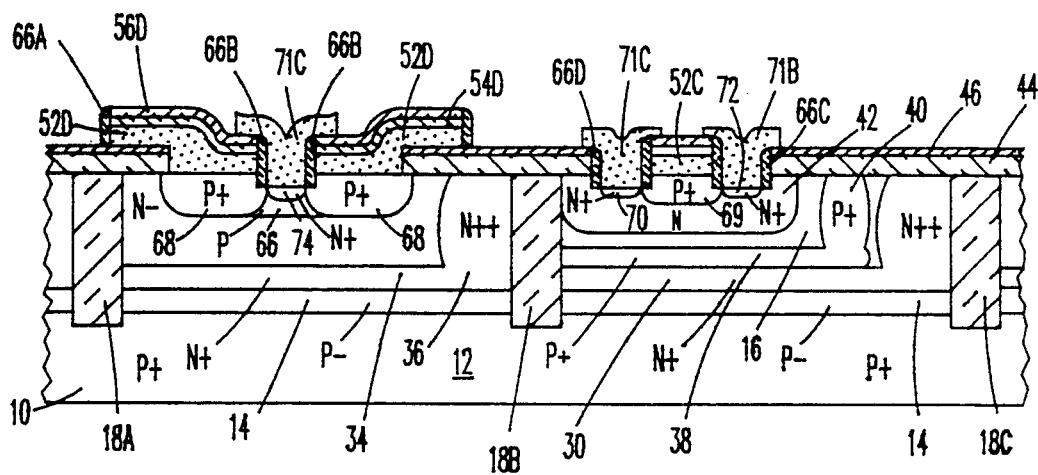

Referring now to FIG. 9, conventional photolithographic masking techniques are used to pattern layer 71, leaving extrinsic base contact regions 71A, 71B bounding lateral sides of emitter contact 52C and spaced therefrom by insulating sidewall 66C. This patterning of layer 71 further leaves an emitter contact region 71C generally centered within extrinsic base contact 52D and insulated therefrom by sidewall 66B. Layer 71 is patterned, for example, by the use of a RIE process with Cl$_2$/O$_2$/Ar gases.

Figure 10:
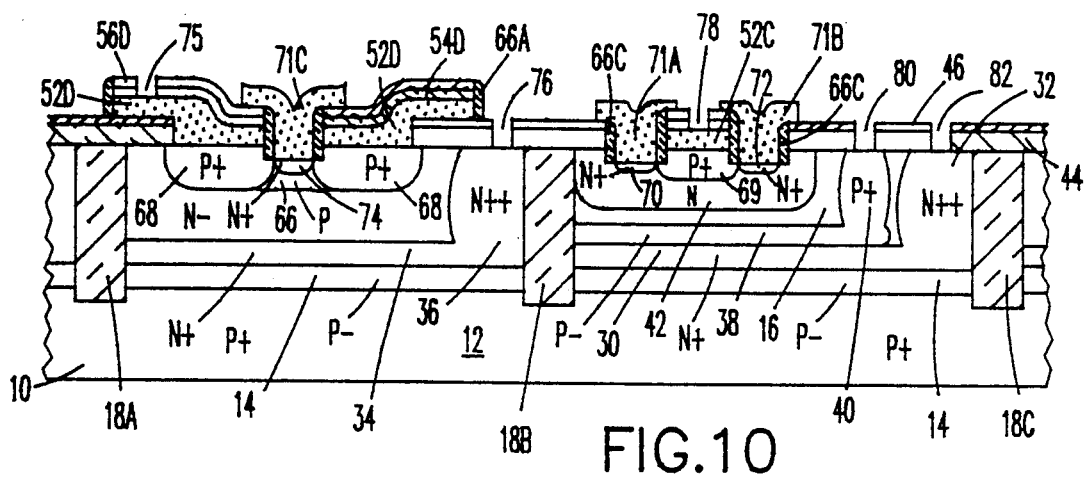

Referring now to FIG. 10, the device is shown with the following apertures formed to accommodate electrical contacts: aperture 75 to NPN base contact 52D; aperture 76 to NPN subcollector reachthrough region 36; aperture 78 to PNP emitter contact 52C; aperture 80 to PNP subcollector reachthrough region 40; and aperture 82 to PNP ground reachthrough 32. Each of these apertures is formed by conventional photolithographic masking, followed by etching through a nitride-over-oxide stack. This etching is performed, for example, using a RIE process with CF$_4$/CHF$_3$/Ar gases.

Figure 11:
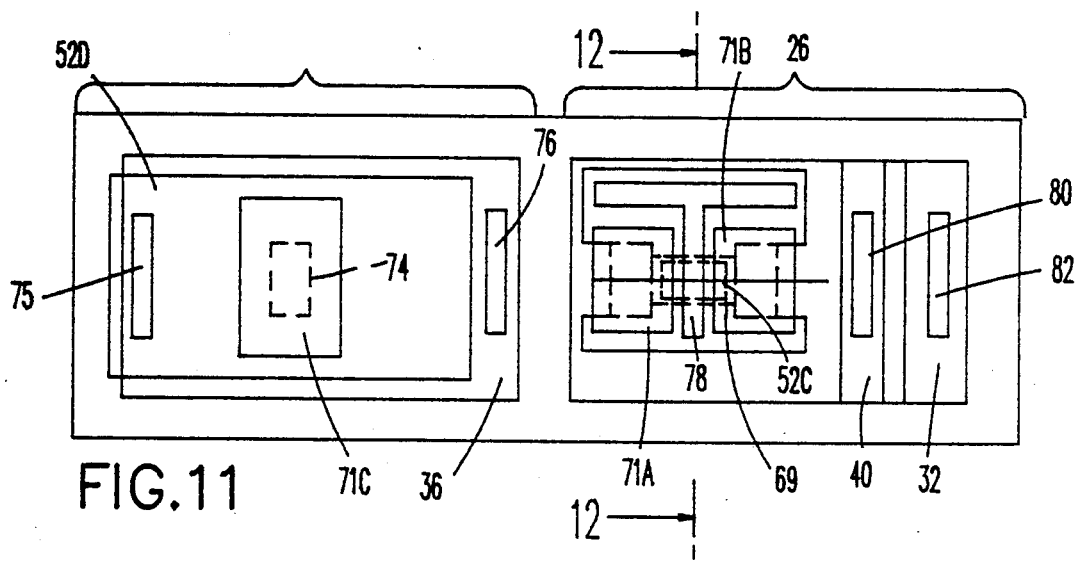
FIG. 11 is a top view of the structure of FIG. 10.
Figure 12:
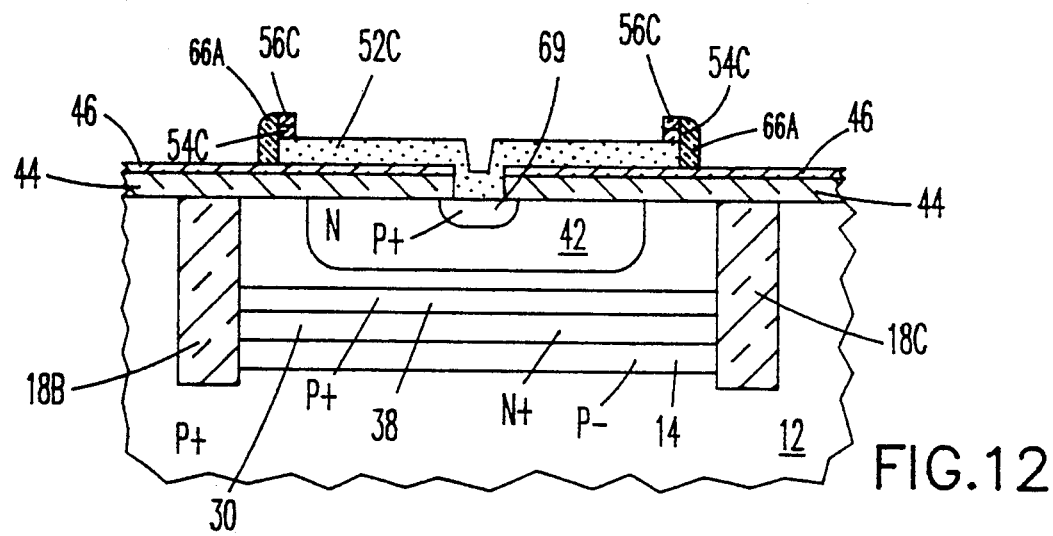
FIG. 12 is a cross-sectional view of FIGS. 10 and 11 taken at 12—12.

Referring to FIGS. 10, 11 and 12 together, it is seen that the NPN transistor in device region 28 is generally rectangular in nature, emitter region 74 being surrounded by base regions 66, 68. In contrast, emitter region 69 of the PNP transistor in device region 26 generally bridges the laterally extending extrinsic base regions 70 and 72, while being surrounded by intrinsic base region 42. The device shown in FIGS. 10 and 11 is completed through the application of conventional, multi-level metallization, many types of which are known to those skilled in the art.

There is thus provided a new and improved method for fabricating a complementary bipolar device—i.e. complementary NPN and PNP transistors formed in the same semiconductor substrate. The process steps used to fabricate the PNP transistor are state-of-the-art, self-aligned, transistor fabrication techniques. The PNP transistor includes self-aligned regions formed without requiring high-tolerance photolithographic alignment, particularly the spacing between the base and emitter contacts which is set by an insulating sidewall.

The present invention provides many significant advantages over the prior art. Due to the simultaneous formation of the PNP emitter and NPN extrinsic base contacts, and the similar, simultaneous formation of the NPN emitter and PNP extrinsic base contacts, the process of the subject invention requires a minimal number of masking steps. The forming of the P+subcollector of the PNP transistor by ion implantation eliminates conventional auto-doping problems experienced during patterned subcollector formation. Further, the series resistance of ion implanted P+subcollector region 38 is desirably low so as to inhibit device saturation. Base resistance, R$_{bb'}$, is desirably low, and the base/emitter and base/collector junction capacitances are small for both the NPN and PNP transistors.

The resulting NPN transistor is a high performance device, while the PNP transistor also exhibits excellent, high-performance operating characteristics—including speed and frequency response approaching those of the NPN transistor.

The present invention has application in the formation of integrated circuits, and particularly in the field of very large scale integrated (VLSI) circuits.

While the present invention has been shown and described with respect to particular embodiments, numerous changes, modifications, and improvements falling within the spirit and scope of the invention will occur to those skilled in the art.

What is claimed is:

1. Method of forming a complementary bipolar transistor device comprising the steps of:
   providing a substrate of semiconductor material including at least two electrically isolated N-type device regions having a generally planar common surface;

forming a P-type buried subcollector region in a first of said device regions;

forming an N-type buried subcollector region in a second of said device regions;

forming an N-type base region in said common surface of said first device region;

forming a layer of P-doped polysilicon over said base region in said first device region and over said second device region;

patterning said layer of P-doped polysilicon to form an emitter contact generally centered on said base region of said first device region and a generally annular base contact on said second device region;

forming a layer of insulating material over the patterned said layer of P-doped polysilicon;

forming a layer of N-doped polysilicon generally conformally over the device;

patterning said layer of N doped polysilicon to form a base contact generally surrounding said emitter contact on said first device region and an emitter contact generally surrounded by said base contact on said second device region; and heating said device at least once to drive impurities from said base and emitter contacts on said first and second device regions into said device regions whereby to form a vertical PNP transistor in said first device region and a vertical NPN transistor in said second device region.

2. A method in accordance with claim 1 wherein said step of providing said substrate includes the steps of:

providing a P-type semiconductor slab defining a generally planar first surface;

epitaxially growing an N-type semiconductor layer over said first surface, said N-type semiconductor layer defining said common surface; and forming isolating regions extending from said common surface into said slab so as to separate said device regions.

3. A method in accordance with claim 2 and further including the step of epitaxially growing a lightly doped P-type region intermediate said slab and said N-type semiconductor layer.

4. A method in accordance with claim 2 and further including the step of forming a highly doped N-type buried region in said first device region intermediate said buried subcollector region and said slab, said N-type buried region formed concomitantly with said N-type subcollector region in said second device region.

5. A method in accordance with claim 4 and further including the step of forming an N-type reachthrough region from the surface of said first device region into contact with said N-type buried region in said first device region.

6. A method in accordance with claim 1 and further including the step of forming an N-type reachthrough region from the surface of said second device region into contact with said subcollector region in said second device region.

7. A method in accordance with claim 1 and further including the step of forming a P type reachthrough region from the surface of said first device region into contact with said P-type subcollector region in said first device region.

8. A method in accordance with claim 1 and further including the steps of:

forming a layer of insulating material over the surface of said first and second device regions before performing said step of forming said layer of P-doped polysilicon; and patterning said layer of insulating material to expose a portion of each of said first and second device regions.

9. A method in accordance with claim 1 wherein said step of forming said insulating layer on the patterned P-doped polysilicon layer includes the step of forming sidewalls of insulating material on the exposed edges of said layer of P-doped polysilicon.

10. A method in accordance with claim 1 and further including the step of forming a P-type extrinsic base region in said second device region by depositing impurities thereinto after said step of patterning said layer of P-doped polysilicon.

11. A method in accordance with claim 1 and further including the steps of:

removing a portion of the surface of said N-type base region in said first device region to form a recess in said N-type base region; and insulating the wall of said N-type base region formed by said last-recited removing step;

whereby said base contact for said first device region is formed at least partially within said recess.

* * * * *